(12) United States Patent
Fajardo

(10) Patent No.: US 6,764,318 B1
(45) Date of Patent: Jul. 20, 2004

(54) SELF-CENTERING PRESS-FIT CONNECTOR PIN USED TO SECURE COMPONENTS TO A RECEIVING ELEMENT

(75) Inventor: Iggoni Fajardo, Sunol, CA (US)

(73) Assignee: Fourte Design & Development, LLC, Sunol, CA (US)

( * ) Notice: Subject to any disclaimer, the term of this patent is extended or adjusted under 35 U.S.C. 154(b) by 0 days.

(21) Appl. No.: 10/402,751

(22) Filed: Mar. 28, 2003

(51) Int. Cl.[7] .............................................. H01R 12/00
(52) U.S. Cl. ..................... 439/82; 439/108; 439/567; 439/608; 439/541.5
(58) Field of Search .......................... 439/82, 108, 567, 439/608–610, 541.5

(56) References Cited

U.S. PATENT DOCUMENTS 6,196,870 B1 * 3/2001 Wu ............................. 439/567
6,443,768 B1 * 9/2002 Dirkers et al. .............. 439/607
6,508,670 B1 * 1/2003 Hwang ....................... 439/607

\* cited by examiner

*Primary Examiner*—Truc Nguyen
(74) *Attorney, Agent, or Firm*—The Kline Law Firm

(57) ABSTRACT

A self-centering press-fit pin that is typically used to secure components to a printed circuit board (PCB). The device includes more than one leg, the legs providing connection points for the component on which the pins are installed. The pin is formed so that the legs act as leaf springs to securely hold the connector in place in the proper installation hole in the board on which the component is installed. The pins are stamped from sheet metal with a progressive die process. By changing the amount of flexion in the legs of the pin, the pressure required to insert the pin into, and remove the pin from, a connection hole can be varied.

4 Claims, 4 Drawing Sheets

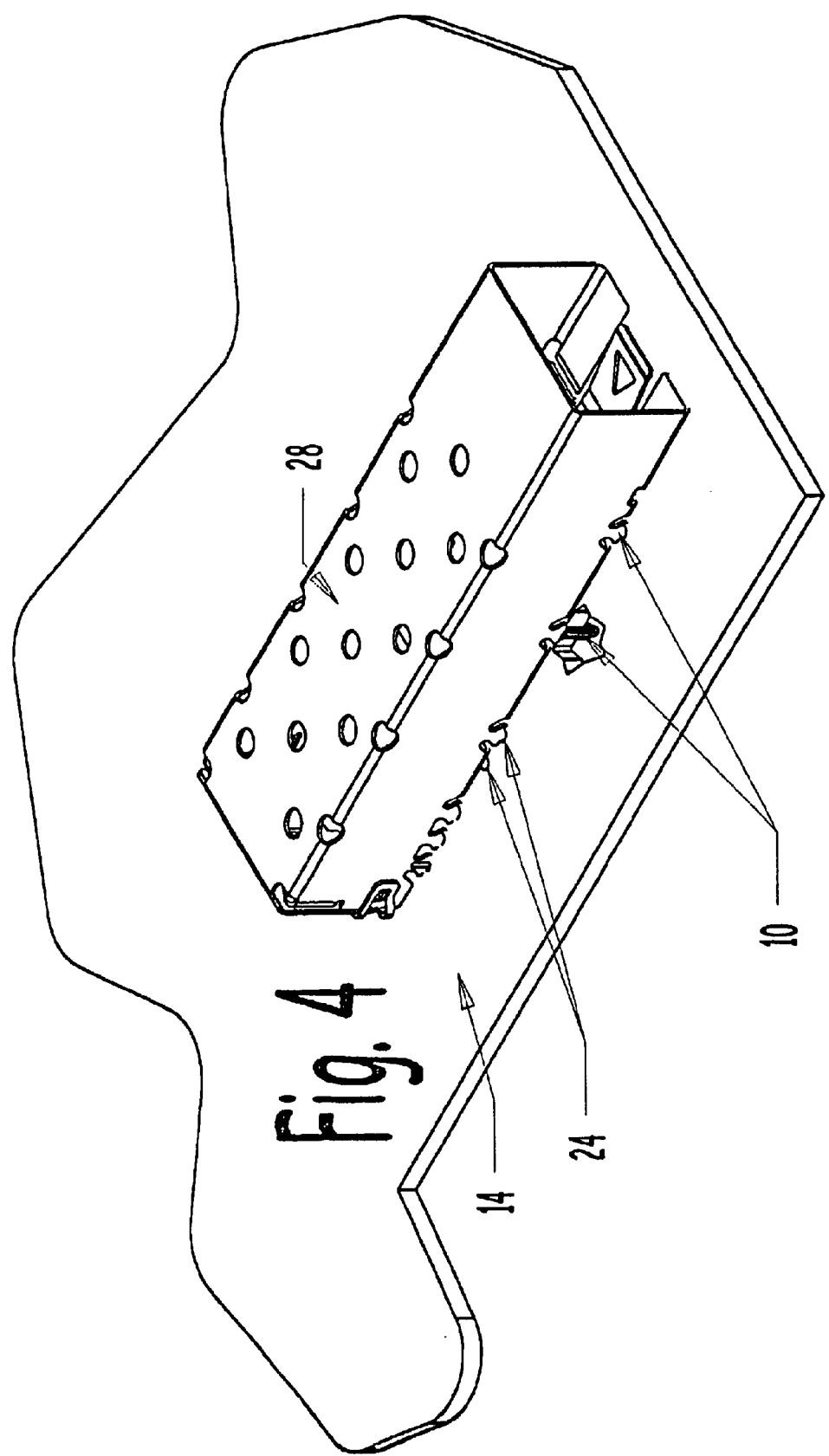

SELF-CENTERING PRESS-FIT CONNECTOR PIN USED TO SECURE COMPONENTS TO A RECEIVING ELEMENT

BACKGROUND OF THE INVENTION

1. Field of the Invention

The present invention relates generally to connection means for electronic components, and more particularly is a multiple leg press-fit pin typically used to secure an electronic component to a printed circuit board (PCB).

2. Description of the Prior Art

The manufacture of electronic devices is one of the largest business segments in current day industry. The manufacturing processes used in this area are therefore the subject of much interest in the technology community. The present invention is directed generally to the area of PCB assembly.

Current art usually requires that components be soldered to the board on which the components are to be installed. This connection method is used on the vast majority of electronic components. While soldering is the tried and true method of connection for electronic components, the method is quite time consuming and labor intensive, thereby adding to the cost of the finished board.

One alternative method of connection of the components to the board is a press-fit connector. One type of current art press-fit connector is a connector that comprises inner and outer shells. This current art connector is usually formed with a teardrop shape, so that the connector utilizes a teardrop-within-a-teardrop construction. When the teardrop-within-a-teardrop connecter of the electronic component is inserted into the board, the outer teardrop is crushed into connection with the inner teardrop. The connector retains sufficient diameter so that the component is secured on the board. One major limitation of this connector means is that the component cannot be placed on the board and then removed. The connector is a "one time" connector only.

Accordingly, it is an object of the present invention to provide a means for connecting an electronic component to a PCB.

It is a further object of the present invention to provide a connection means that is press-fit into the PCB.

It is a still further object of the present invention to provide a connection means that is easily removable from the board, with the connector being reusable.

SUMMARY OF THE INVENTION

The present invention is a self-centering press-fit pin used to secure components, e.g. electronic components and shielding, to a printed circuit board (PCB). The device comprises at least one leg that provides an electrical connection point for the electrical component on which the pins are installed. The pin is formed so that the legs act as leaf springs to securely hold the connector in place in the proper installation hole in the board on which the component is installed. The pins are stamped from sheet metal with a progressive die process. By changing the amount of flexion in the legs of the pin, the pressure required to insert the pin into a connection hole can be varied.

An advantage of the present invention is that the pins allow the elimination of soldering to connect a component to a PCB.

Another advantage of the present invention is that the legs of the connector provide a convenient means to connect the component to ground on the board.

A still further advantage of the present invention is that the pins allows an electronic component to be removed and reinserted into a board without modification of the connecting pins.

These and other objects and advantages of the present invention will become apparent to those skilled in the art in view of the description of the best presently known mode of carrying out the invention as described herein and as illustrated in the drawings.

BRIEF DESCRIPTION OF THE DRAWINGS

FIG. 4 shows the connector pin securing a fiber optic transceiver receptacle to a PCB.

DETAILED DESCRIPTION OF THE INVENTION

The present invention is a self-centering press-fit connector pin 10 used to secure a component 12, typically an electronic component or shielding, to a receiving element 14, typically a generally planar printed circuit board (PCB). The connector pin 10 was developed as a securing means for an SFP (Small Form-factor Pluggable) Fiber Optic Transceiver Receptacle. The device therefore complies with all SFP MSA (Multi Source Agreement) standards. In the preferred embodiment, the connector pins 10 are stamped from sheet metal in a progressive die process.

Figure 1:
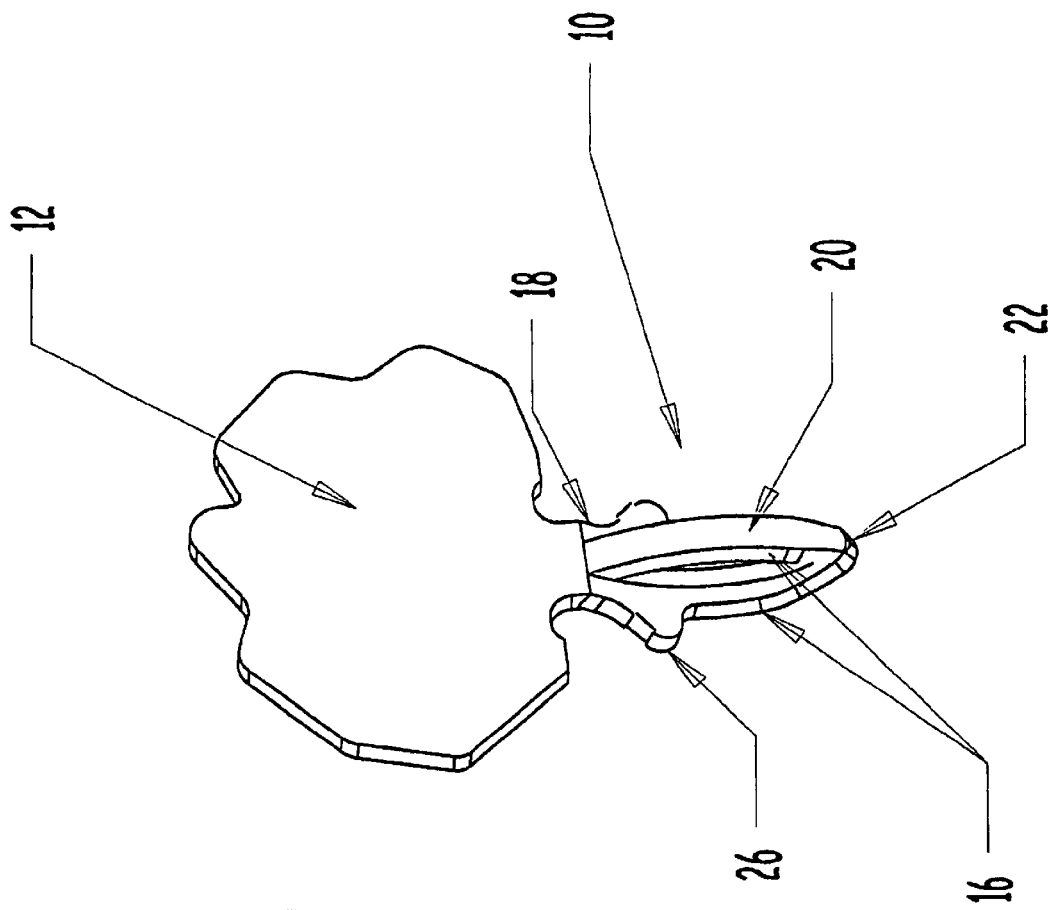
FIG. 1 is a perspective view of the connector pin of the present invention.
Figure 3:
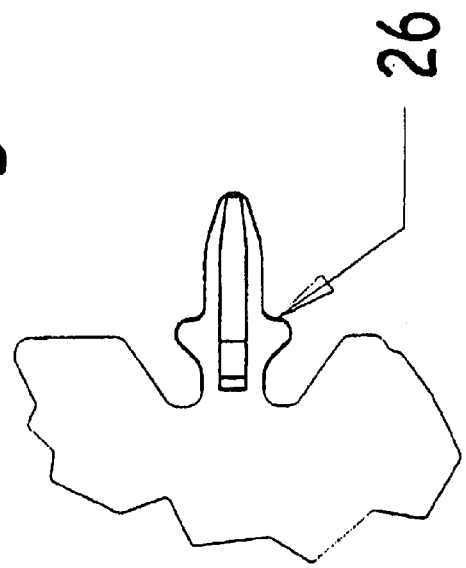
FIG. 3 is a side view of the connector pin rotated 90° from the position shown in FIG. 2.
Figure 2:
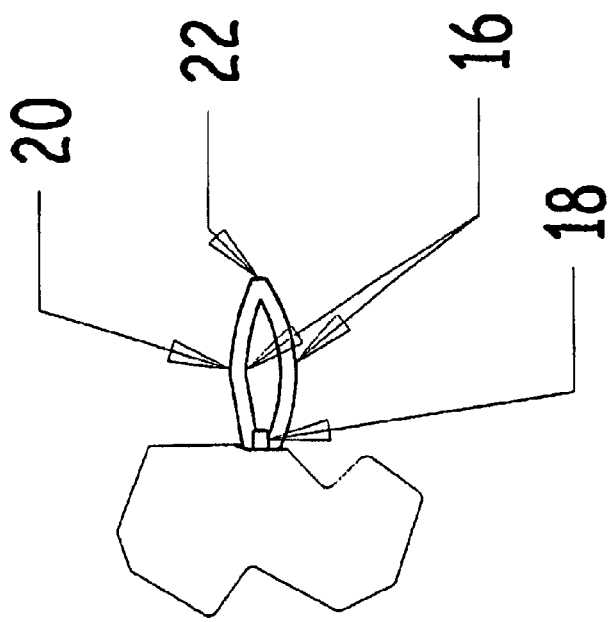
FIG. 2 is a side view of the connector pin.

Referring first to FIGS. 1–3, the connector pin 10 comprises at least three legs 16 that form the securing means of the connector pin 10. When the application under consideration is an electrical component 12 being attached to a PCB 14, the legs 16 provide electrical grounding connection points for the electrical component 12. In the preferred embodiment, the connector pin 10 comprises at least three legs 16 so that a three-point (or more) contact is formed. The legs 16 extend outward from a base 18 of the connector pin 10. The base 18 is used to affix the connector pin 10 to the component 12. In the preferred embodiment, the connector pin 10 is formed as an integral portion of the component 12. The base 18 is therefore integral to the wall of the component 12 that is to be affixed to the PCB 14. It should of course be recognized by those skilled in the art that the connector pin 10 can be readily manufactured as an independent element, and later attached to the component 12, by any of several applicable known means, such as soldering, welding, or insert molding.

Each leg 16 of the connector pin 10 is arced outward from a central longitudinal axis of the connector pin 10 toward a central portion 20 where the diameter of the connector pin 10 is at a maximum. The legs 16 then arc back inward to a common terminal section 22. The arciform nature of the legs 16 allow the legs 16 to act as leaf springs when the connector pin 10 is inserted into the PCB 14. As the connector pin 10 is inserted into the appropriate receiving hole 24 in the PCB 14, the legs 16 are slightly compressed as the central portion 20 in inserted into the PCB 14. This compression creates a flexion force that ensures a tight contact point between each leg 16 and the surface of the receiving hole 24 in the PCB 14. Each leg 16 therefore acts as a spring urging each of the other legs 16 into a secure contact position with the surface of the PCB 14.

The magnitude of the flexion force can be easily and accurately controlled by varying the amount of arc placed in the leg 16 during the manufacturing process. The amount of force required to insert and to remove the connector pin 10 from the PCB 14 can therefore be varied according to the requirements of the specific application utilizing the connector pin 10. By maintaining the flexion force within non-destructive operating bounds, the connector pin 10 of the present invention can be used repeatedly without significant degradation in securing capability. The flexion force created by the legs 16 also makes the connector pin 10 a self-centering element.

In order to ensure that the component 12 being attached to the board 14 is seated at a completely repeatable height relative to the board 14, one or more of the legs 16 of the connector pin 10 can be provided with a protruding seating shoulder 26. The seating shoulder 26 extends outward from the outward arcing portion of the leg 16. The shoulder 26 contacts the upper surface of the PCB 14 when the component 14 is plugged into the board 14. In the preferred embodiment, two of the three legs 16 include seating shoulders 26. The seating shoulders 26 guarantee that the component 12 being installed is always at the same level relative to the board 14 after the component 12 is plugged into the board 14.

FIG. 4 shows a typical use of the connector pin 10. In this illustration, the connector pins 10 are used as to secure an SFP Fiber Optic Transceiver Receptacle 28 to the PCB 14.

ALTERNATE EMBODIMENT

Figure 5:
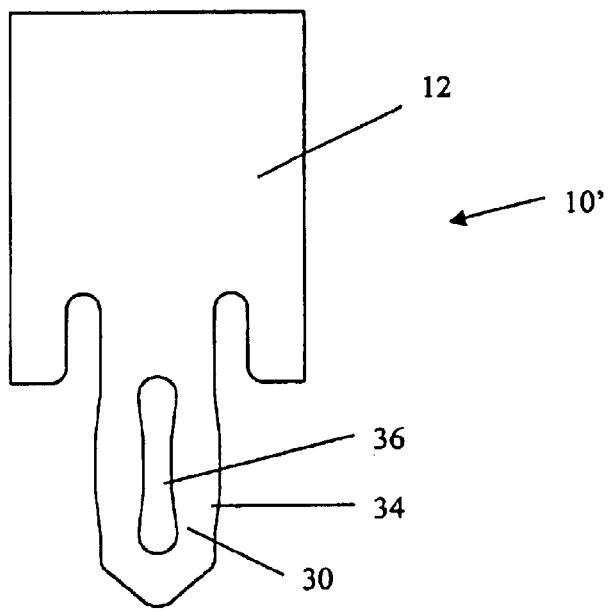
FIG. 5 shows an alternate embodiment of the connector pin of the present invention prior to forming.
Figure 6:
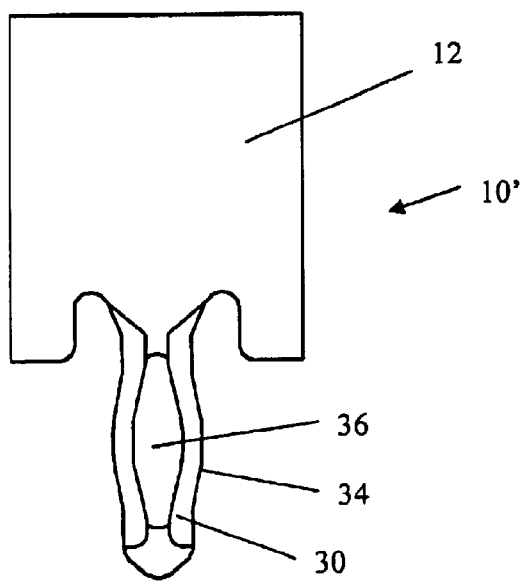
FIG. 6 shows the connector pin of FIG. 5 following forming.

Referring now to FIGS. 5 and 6, a first alternate embodiment of the connector pin 10' of the present invention is formed by successive stamping. The flat blank shown in FIG. 5 is formed into the partially open cylindrical shape illustrated in FIG. 6. The blank includes a pin extension 30 with a widened middle section 34 and a central opening 36.

Following forming, the pin 10' is in the conformation shown in FIG. 6. The central opening 36 is expanded during forming. The middle section 34 is curved into a projection with a circular cross section, the cross section varying from end to end, with a maximum at a midpoint. The curved middle section 34 provides a large contact area for connection with whatever component is being used with the pin 10'. The central opening 36 allows the two connection posts formed from the middle section 34 to flex when the pin 10' is inserted into a receiving board. This ensures a secure connection.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

I claim:

1. A connector pin that secures an electronic component to a receiving element with receiving holes therein, said connector pin comprising:

a base, more than one leg, and a terminal section; wherein said legs are arced outward from a first end of said connector pin relative to a central longitudinal axis of said connector pin toward a midpoint of said connector pin, a diameter of said connector pin being at a maximum at said midpoint, said legs then arcing inward toward a common terminal section so that said legs are bowed symmetrically about said longitudinal axis, a tension generated by said bowing of said legs causing said legs to act as a leaf spring when said connector pin is inserted into one of the receiving holes of the receiving element, said legs being slightly compressed as said midpoint enters the receiving hole to create a flexion force, said flexion force ensuring a tight contact point between each of said legs and a surface of the receiving hole in the receiving element, and each said leg is arced about a longitudinal axis, so that outer surfaces of said legs lie on arcs of a circle.

2. The connector pin of claim 1 wherein:

said connector pin is formed as an integral portion of said component.

3. The connector pin of claim 1 wherein:

at least one of said legs comprises a protruding seating shoulder, said seating shoulder contacting an upper surface of said receiving element when said component being mounted is plugged into said receiving element.

4. The connector pin of claim 1 wherein:

a magnitude of said flexion force is varied by varying an amount of at-rest arc placed in said legs during manufacturing.

* * * * *